United States Patent
Shimizu

(10) Patent No.: US 10,043,577 B2
(45) Date of Patent: Aug. 7, 2018

(54) SEMICONDUCTOR MEMORY DEVICE

(71) Applicant: TOSHIBA MEMORY CORPORATION, Minato-ku, Tokyo (JP)

(72) Inventor: Naoki Shimizu, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/265,759

(22) Filed: Sep. 14, 2016

(65) Prior Publication Data

US 2017/0263316 A1  Sep. 14, 2017

Related U.S. Application Data

(60) Provisional application No. 62/305,476, filed on Mar. 8, 2016.

(51) Int. Cl.
*G11C 11/00* (2006.01)
*G11C 13/00* (2006.01)

(52) U.S. Cl.
CPC ........ *G11C 13/0069* (2013.01); *G11C 13/004* (2013.01); *G11C 13/0026* (2013.01); *G11C 13/0028* (2013.01); *G11C 11/00* (2013.01)

(58) Field of Classification Search
CPC ............ G11C 13/0069; G11C 11/1675; G11C 13/0004; G11C 11/5628; G11C 13/0002; G11C 13/0023; G11C 16/10; G11C 2013/0078; G11C 2013/0092; G11C 2029/5006; G11C 11/5678; G11C 2207/229

See application file for complete search history.

(56) References Cited

U.S. PATENT DOCUMENTS

| 6,269,048 | B1 | 7/2001 | Kano et al. | |
|---|---|---|---|---|
| 6,359,813 | B1 | 3/2002 | Uchida et al. | |
| 2002/0015328 | A1 | 2/2002 | Dono et al. | |
| 2009/0052233 | A1* | 2/2009 | Nakai | G11C 7/1048 365/163 |
| 2010/0182829 | A1* | 7/2010 | Nakai | G11C 7/1078 365/163 |
| 2015/0363257 | A1* | 12/2015 | Kwon | G11C 13/0033 714/6.11 |

* cited by examiner

*Primary Examiner* — Uyen B Tran
(74) *Attorney, Agent, or Firm* — Holtz, Holtz & Volek PC

(57) ABSTRACT

According to one embodiment, a semiconductor memory device comprises a memory cell and a first circuit. The first circuit is configured to generate a write pulse based on a write command and supply a write current to the memory cell in accordance with the write pulse. The first circuit generates a first write pulse when the first circuit receives a first write command. The first circuit extends the first write pulse when the first circuit receives a second write command within a first time after reception of the first write command.

9 Claims, 14 Drawing Sheets

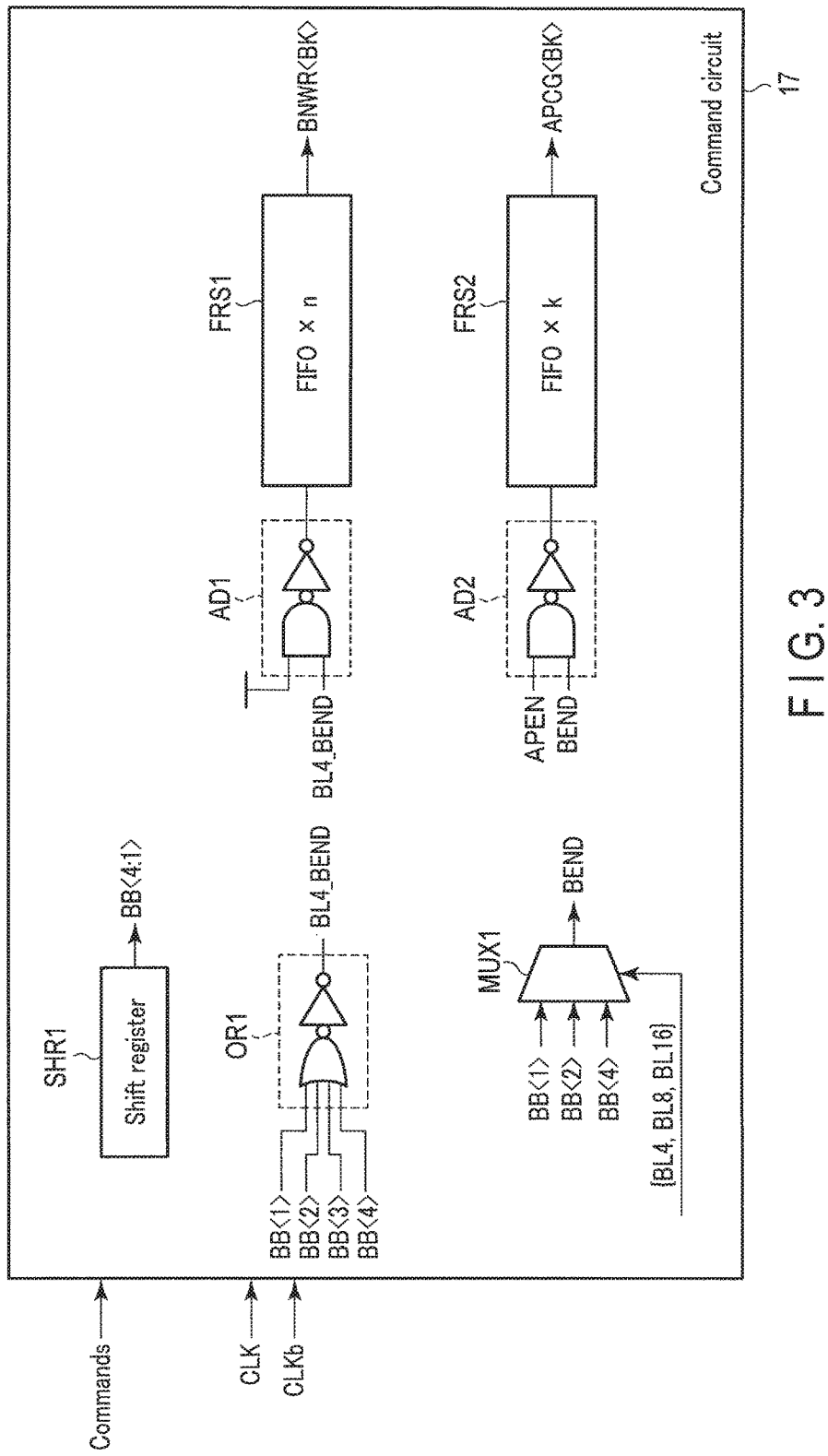
F I G. 3

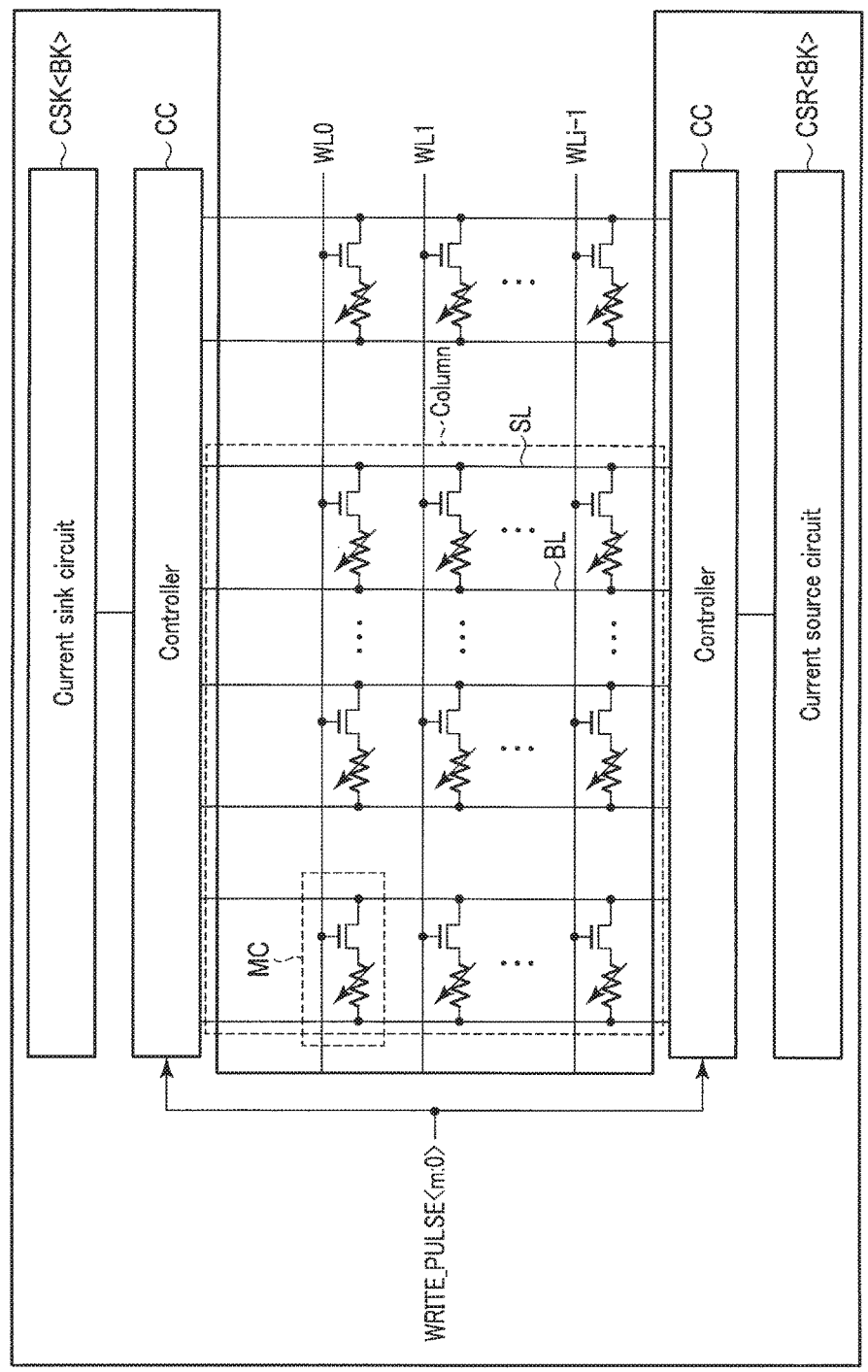
F I G. 5

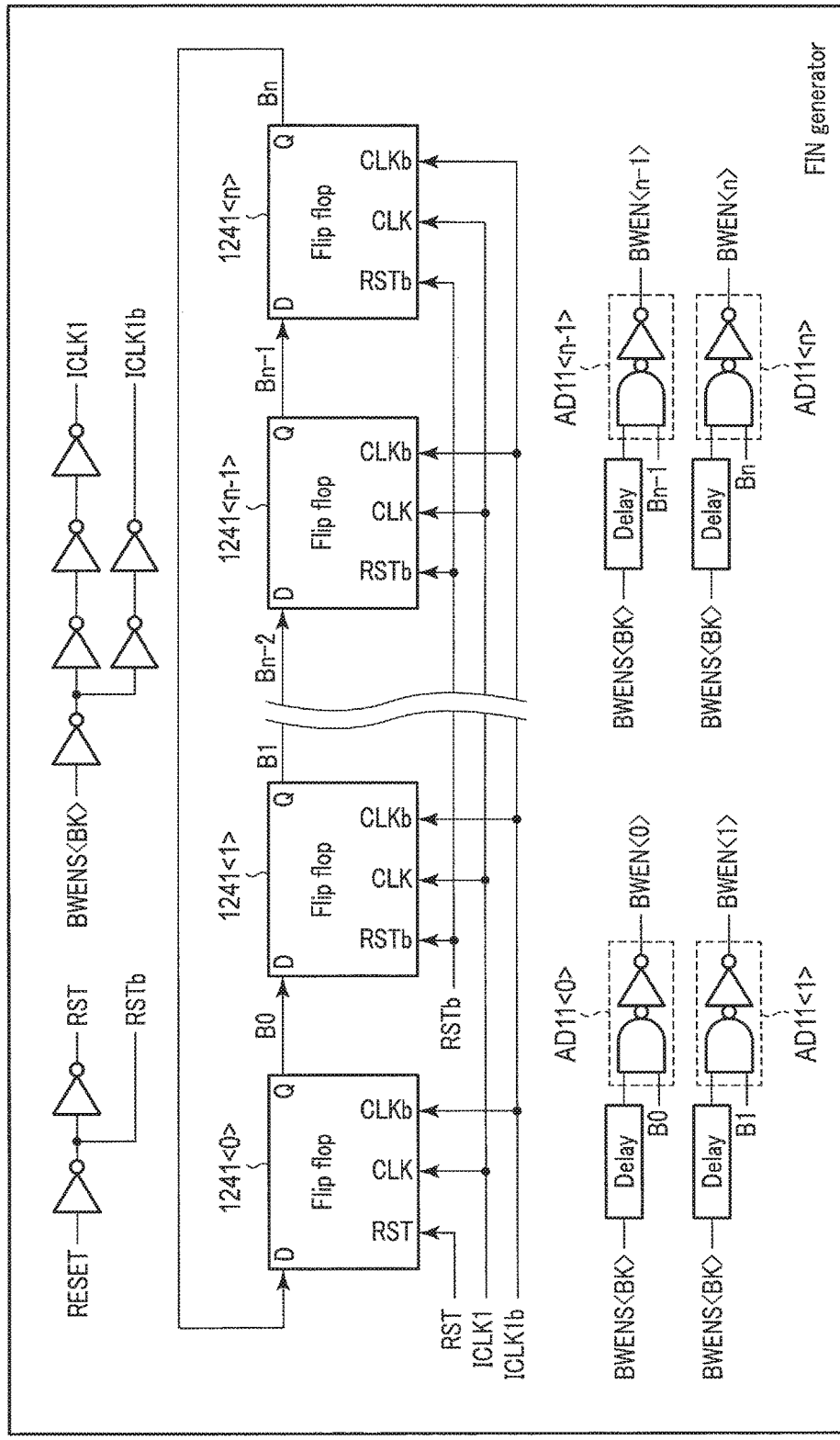
F I G. 6

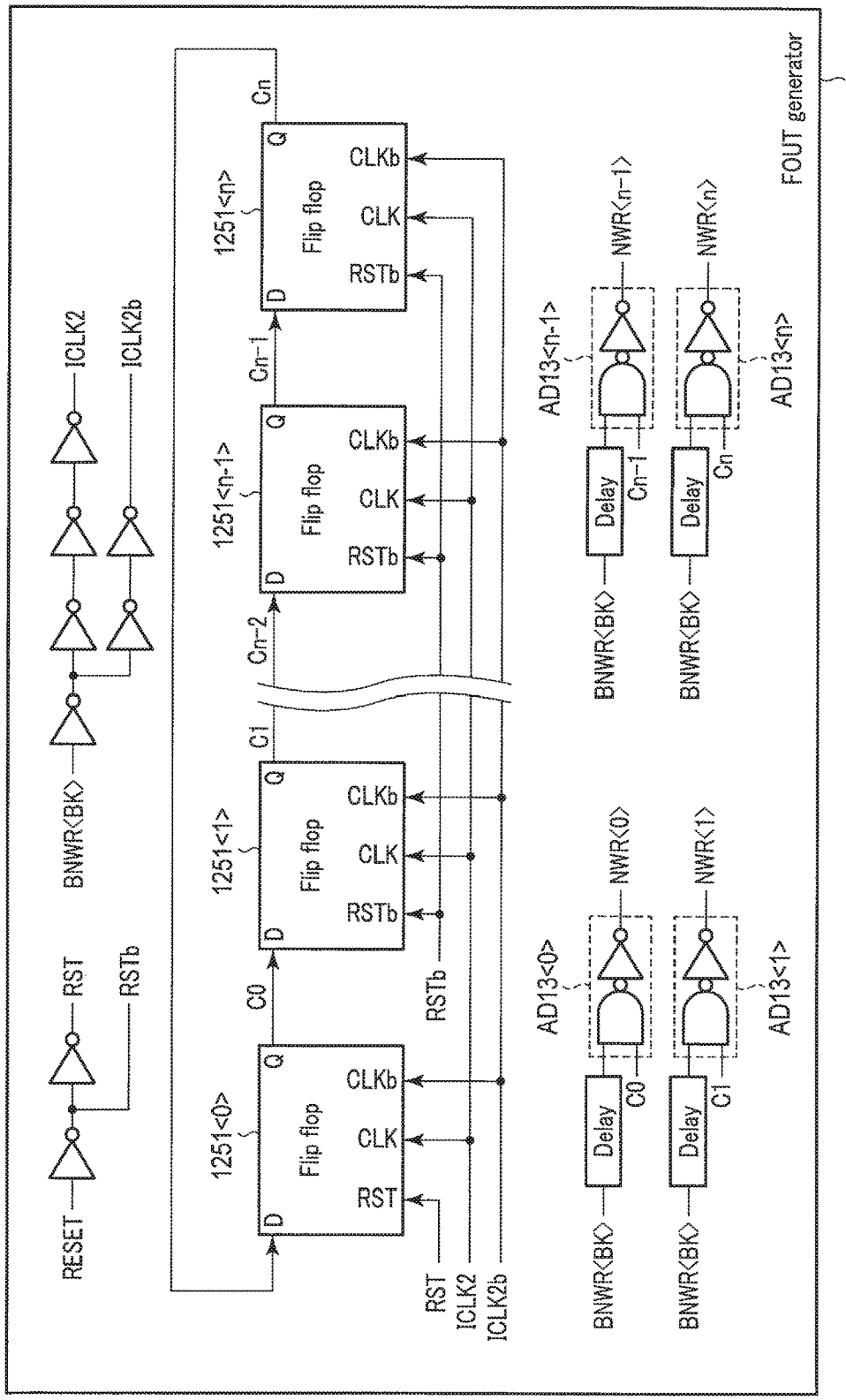
F I G. 7

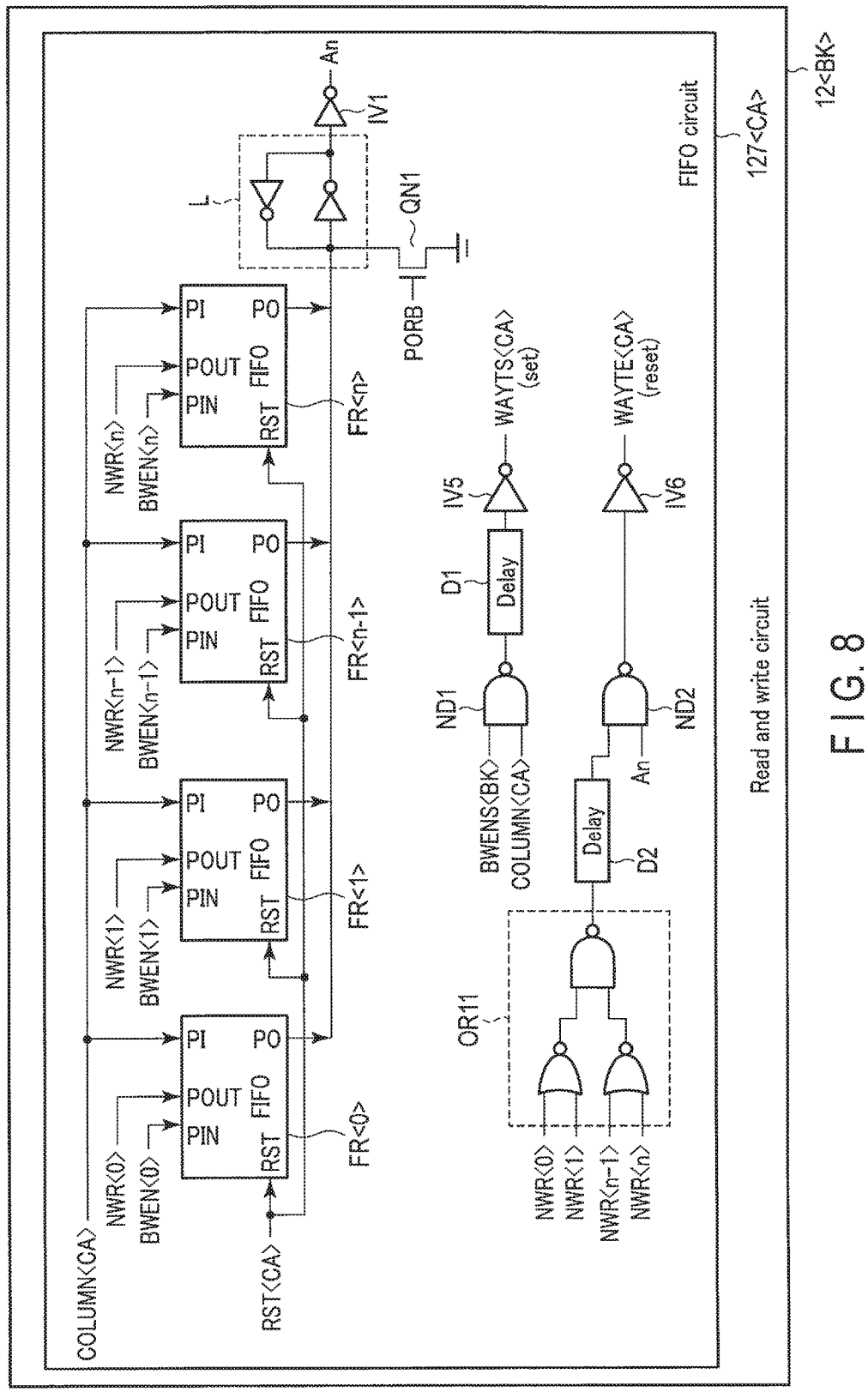
F I G. 8

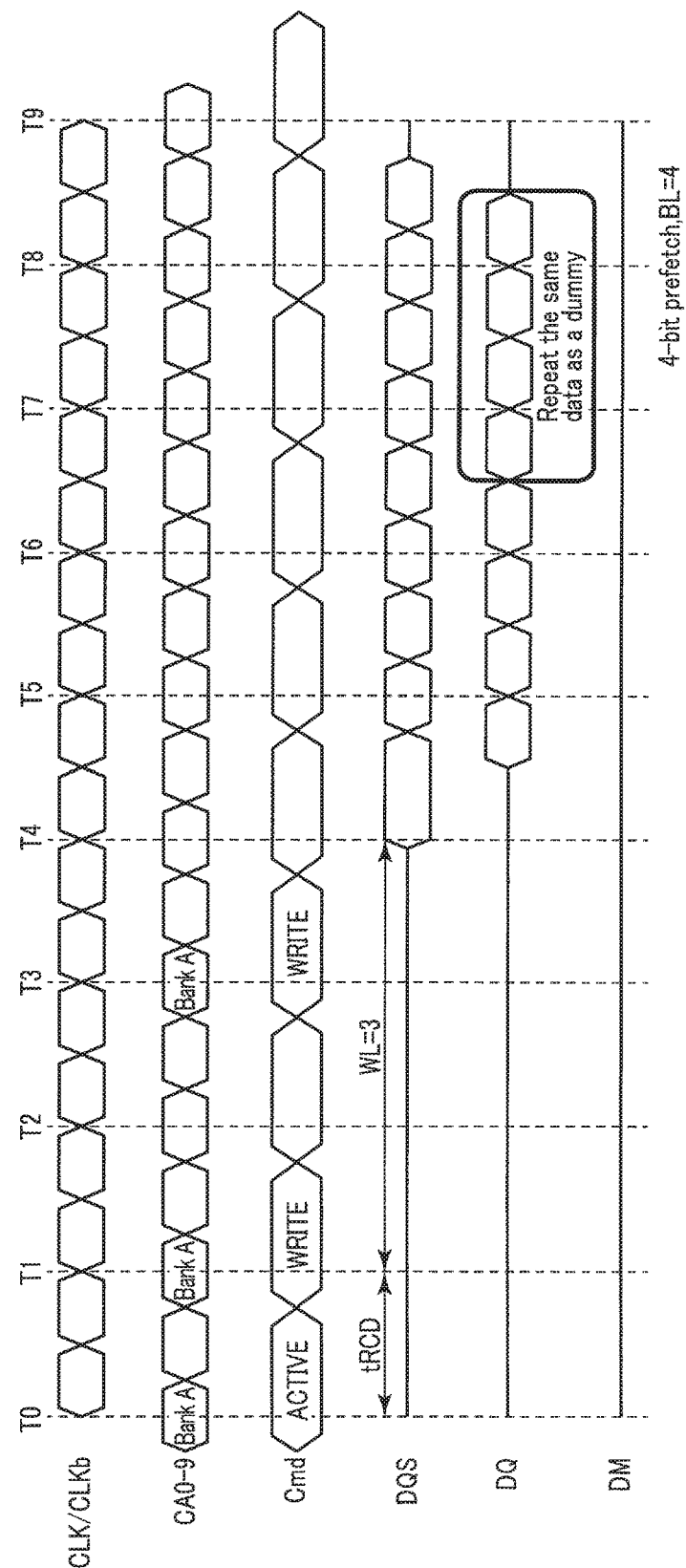
F I G. 11

| Command | BA[2:0] | C[5:2] |
|---|---|---|
| Active | 0 | - |
| Write | 0 | 0 |
| VNOP | - | - |
| Write(w/DM) | 0 | 0 |
| NOP | - | - |
| Write | 0 | 1 |
| VNOP | - | - |
| Write(w/DM) | 0 | 1 |
| NOP | - | - |

FIG. 13

| Frequency [MHz] | tCK [ns] | VNOP Extended by X[ns] | |
|---|---|---|---|
| | | X = 10 | X = 20 |
| 533 | 1.875 | 5cycles | 10cycles |
| 466 | 2.15 | 4cycles | 9cycles |
| 400 | 2.5 | 3cycles | 7cycles |
| 333 | 3 | 3cycles | 6cycles |
| 266 | 3.75 | 2cycles | 5cycles |
| 200 | 5 | 1cycle | 3cycles |

FIG. 14

SEMICONDUCTOR MEMORY DEVICE

CROSS-REFERENCE TO RELATED APPLICATIONS

This application claims the benefit of U.S. Provisional Application No. 62/305,476, filed Mar. 8, 2016, the entire contents of which are incorporated herein by reference.

FIELD

Embodiments described herein relate generally to a semiconductor memory device.

BACKGROUND

A semiconductor memory device that utilizes a magnetoresistive effect is known in the art.

BRIEF DESCRIPTION OF THE DRAWINGS

FIG. 3 illustrates part of the elements of a command circuit and how they are connected in the semiconductor memory device of the first embodiment.

FIG. 5 illustrates other elements of function blocks of the read and write circuit in the semiconductor memory device of the first embodiment, and also illustrates how the elements are connected.

FIG. 6 illustrates the elements of a FIN generator and how they are connected in the semiconductor memory device of the first embodiment.

FIG. 7 illustrates the elements of a FOUT generator and how they are connected in the semiconductor memory device of the first embodiment.

FIG. 8 illustrates the elements of a FIFO circuit and how they are connected in the semiconductor memory device of the first embodiment.

FIG. 11 is a timing chart illustrating commands and signals in the writing in the semiconductor memory device of the first embodiment.

FIG. 13 illustrates commands used for writing in a semiconductor memory device of a second embodiment.

FIG. 14 illustrates a command VNOP used for the writing in the semiconductor memory device of the second embodiment.

DETAILED DESCRIPTION

Embodiments will be described with reference to the accompanying drawings. In the description below, structural elements having the same functions and configurations will be denoted by the same reference symbols. Each of the embodiments described below merely shows an exemplary apparatus and method that implement the technical ideas of the embodiments. The technical ideas are not limited to the element materials, shapes, structures, arrangements etc. described below.

Each of the function blocks can be implemented in the form of hardware, computer software or a combination of them. The functional blocks need not be such blocks as will be described below. For example, part of the functions of one exemplary function block may be implemented by another functional block. In addition, an exemplary function block may be divided into more specific function blocks.

In general, according to one embodiment, a semiconductor memory device comprises a memory cell and a first circuit. The first circuit is configured to generate a write pulse based on a write command and supply a write current to the memory cell in accordance with the write pulse. The first circuit generates a first write pulse when the first circuit receives a first write command. The first circuit extends the first write pulse when the first circuit receives a second write command within a first time after reception of the first write command.

[1] First Embodiment

Figure 1:
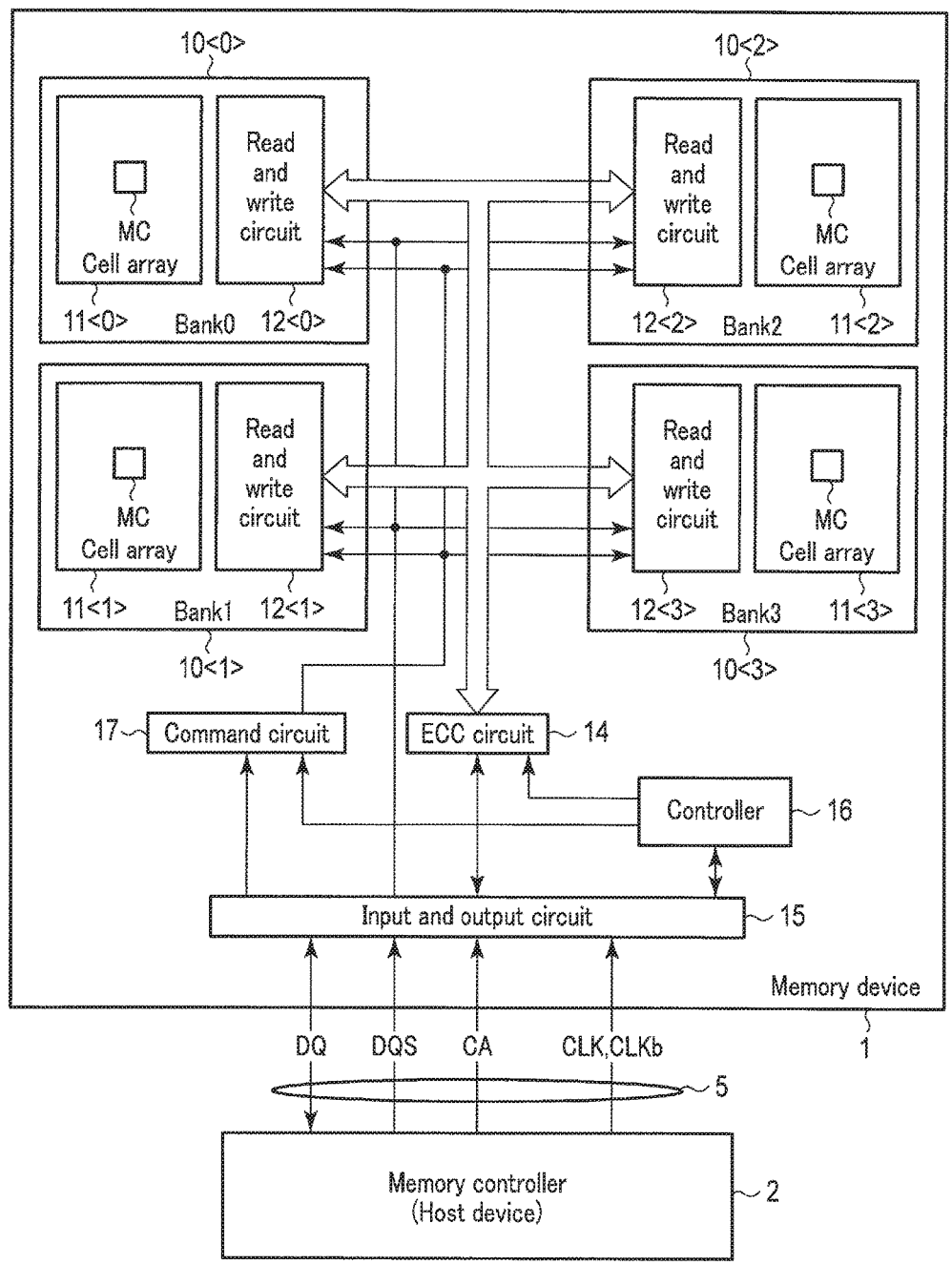
FIG. 1 is a block diagram illustrating a semiconductor memory device according to a first embodiment and a memory controller.

A semiconductor memory device according to the first embodiment will be described.
[1-1] Overall Configuration of Semiconductor Memory Device FIG. 1 illustrates function blocks of a semiconductor memory device 1 according to the first embodiment and a memory controller (or host device) 2. The semiconductor memory device 1 and the memory controller 2 constitute a memory system. For example, the semiconductor memory device 1 can be a dynamic RAM (DRAM), a magnetoresistive RAM (MRAM), a resistive RAM (ReRaM) or a phase change RAM (PCRAM). In the description below, reference will be made to the case where the semiconductor memory device is an MRAM.

The semiconductor memory device 1 is connected to the memory controller 2 by connection lines 5. Through the connection lines 5, the semiconductor memory device 1 receives a power supply voltage, a command/address signal CA, data DQ, a data strobe signal DQS and clocks CLK/CLKb. A signal with suffix "b" is an inverted signal of a signal without suffix "b". The address signal includes an address. The semiconductor memory device 1 transmits data DQ to the memory controller 2 by way of the connection lines 5.

The memory controller 2 includes elements such as a central processing unit (CPU), a RAM, and a read only Memory (ROM), and controls the semiconductor memory device 1 by issuing commands.

The semiconductor memory device 1 includes banks 10 (10<0> to 10<3>), an ECC circuit 14, an input and output circuit 15, a controller 16 and a command circuit 17. The semiconductor memory device 1 includes, for example, eight banks 10, and four of them are shown in FIG. 1.

Bank 10<BK> includes a cell array 11<BK> and a read and write circuit 12<BK>. The value of BK is an identifier (address) of a bank. In the example wherein eight banks 10 are provided, the value of BK is 0 or any natural number not more than 7. Each cell array 11 comprises a plurality of memory cells MC. Memory cell MC retains data in a nonvolatile manner. Various signal lines (not shown) are provided in the area of memory cell array 11. The signal lines include bit lines BL, source lines SL and word lines WL, which are to be described later.

Each read and write circuit 12 controls the write and read operations performed for the corresponding cell array 11. Each read and write circuit 12 includes a driver, a decoder, a page buffer, a sense amplifier, etc. The decoder selects a memory cell MC specified by an address signal supplied from the memory controller 2. The decoder includes a row decoder and a column decoder. The page buffer temporarily stores write data to be supplied to the corresponding bank 10 or read data supplied from that bank 10. The read and write circuit 12 identifies data supplied from a selected memory cell MC or write designated data in the selected memory cell, by applying various voltages to the signal lines or supplying various currents to the signal lines.

The input and output circuit 15 controls the signal transmission between the semiconductor memory device 1 and the memory controller 2. The input and output circuit 15 is connected to the command circuit 17, read and write circuit 12, ECC circuit 14 and controller 16.

The input and output circuit 15 receives a command and an address signal from the memory controller 2 and supplies them to the command circuit 17. The command circuit 17 receives clocks CLK and CLKb and can output various signals at timings based on clocks CLK and CLKb. The command circuit 17 supplies signals which are based on a command and an address signal to the read and write circuit 12.

The input and output circuit 15 supplies an address signal to the read and write circuit 12. Based on the address signal, the read and write circuit 12 controls data read from memory cell MC and data write to memory cell MC.

The ECC circuit 14 adds an error correction code (ECC) to the data to be written in memory cell MC. The ECC circuit decodes the ECC included in data received from a memory cell MC, corrects an error in the received data, and generates data to be read.

Furthermore, the input and output circuit 15 supplies various control signals to the controller 16. The controller 16 includes elements such as a voltage generator and controls the structural elements of the semiconductor memory device 1 based on a received control signal.

Figure 2:
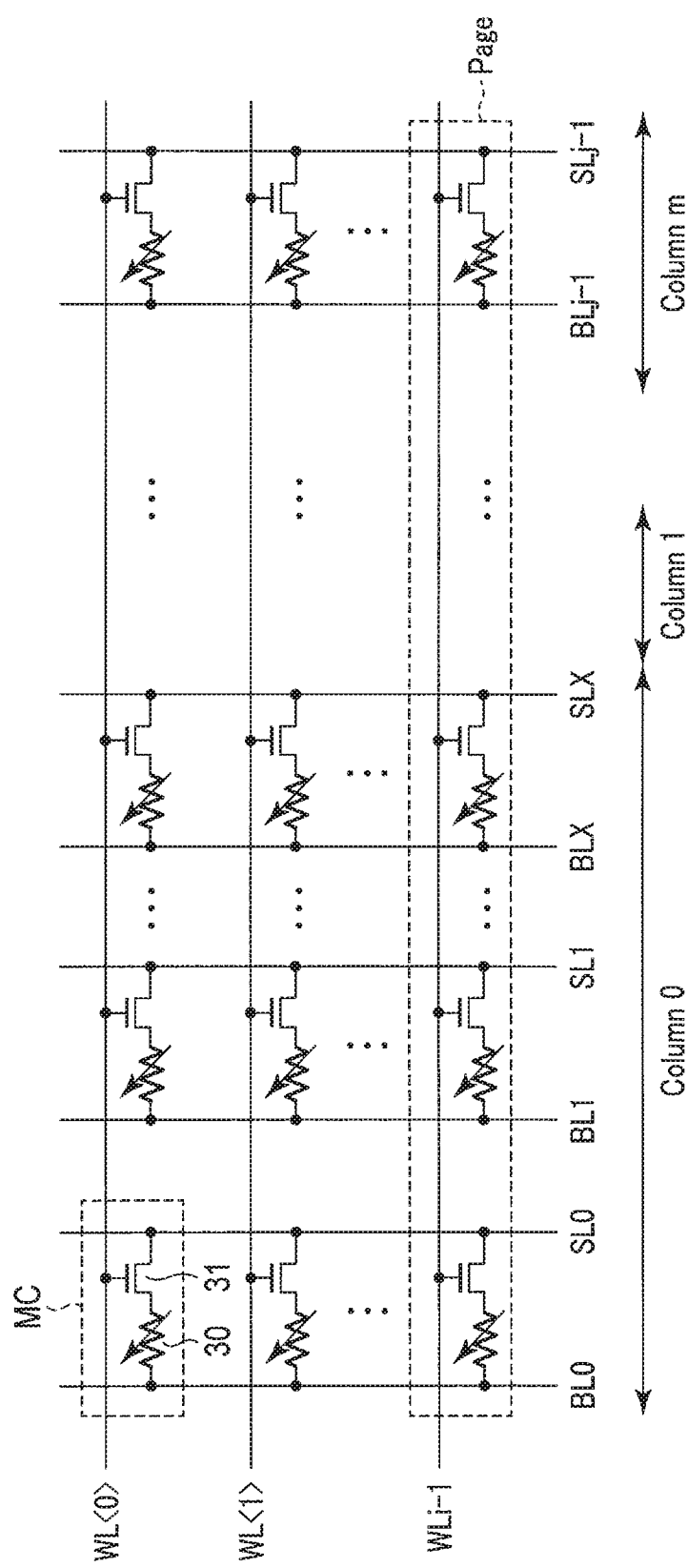
FIG. 2 illustrates the elements of a cell array and how they are connected in the semiconductor memory device of the first embodiment.

Cell array 11 will be described in detail with reference to FIG. 2. FIG. 2 illustrates the elements of the cell array and how they are connected. Memory cells MC are arranged, for example, in a matrix pattern. The cell array 11 comprises i word lines WL (WL0 to WLi−1), j bit lines BL (BL0 to BLj−1) and j source lines SL (SL0 to SLj−1). i and j are natural numbers not less than 0. Memory cells MC of one row are connected to one word line WL, and memory cells MC of one column are connected to one pair formed by one bit line BL and one source line SL.

Each memory cell MC includes a magnetic tunnel junction (MTJ) element 30 and a selection transistor 31. The MTJ element 30 comprises an MTJ, and the MTJ includes two magnetic layers (first and second magnetic layers) and a nonmagnetic layer disposed between the two magnetic layers. The first magnetic layer has a fixed direction of magnetization or magnetic anisotropy. The second magnetic layer has a variable direction of magnetization. The first magnetic layer having a fixed direction of magnetization means that the direction of magnetization is not inverted by the write current flowing through the MTJ element 30.

The MTJ element has a minimal resistance when the directions of magnetization of the two magnetic layers are parallel to each other, and has a maximal resistance when the directions of magnetization of them are antiparallel to each other. Two transition states showing these different resistances are assigned to binary data. When a write current flows from the first magnetic layer to the second magnetic layer, the directions of magnetization of the two layers become parallel to each other. Conversely, when a write current flows from the second magnetic layer to the first magnetic layer, the directions of magnetization of the two layers become antiparallel to each other.

The selection transistor 31 is an n-type metal oxide semiconductor field effect transistor (MOSFET), for example.

One end of each MTJ element 30 is connected to bit line BL, and the other end is connected to the drain (or source) of one selection transistor 31. The gate of each selection transistor 31 is connected to one word line WL, and the source (or drain) thereof is connected to one source line SL.

When one word line WL is activated by the read and write circuit 12, the selection transistor 31 connected to this word line WL is turned on. When the selection transistor 31 is turned on, the MTJ element 30 connected to the selection transistor 31 is connected to one pair of bit line BL and source line SL. A set of memory cells MC connected to one word line WL will be referred to as a "page."

A plurality of pairs of bit lines BL and source lines SL belong to one column. Each bank 10<KB> include (m+1) columns (namely, column 0 to column m). A memory cell for which the read or write operation is performed is specified by the designation of a page address (that is, the designation of a word line WL and a column). In the case of a read operation, the data in all memory cells MC connected to the word line WL selected by the read operation is read and stored in a page buffer (not shown). Part of the data corresponding to one page is further specified by a column address. Thus, data which is part of the one-page data and is specified by the column address is read. Likewise, writing is started by the designation of a target page and a column. A column address is designated together with a read command or a write command.

FIG. 3 shows part of the elements of the command circuit 17. The command circuit 17 receives clocks CLK and CLKb and operates based on clocks CLK and CLKb. The command circuit 17 includes a shift register SHR1, a multiplexer MUX1, AND gates AD1 and AD2, an OR gate OR1, and FIFO register sets FRS1 and FRS2.

The shift register SHR1 receives a read command or a write command supplied to the command circuit 17. Based on external clocks CLK and CLKb, the shift register SHR1 outputs one of signals BB<1> to BB<4> (BB<4:1>) after the elapse of clock cycles (the number of which is based on the burst length set in the semiconductor memory device 1) from the reception of the read or write command. The burst length represents the number of times data to be read or written is output or input in response to one read or write command. Signals BB<1> to BB<4> correspond to the period of the burst length. For example, when the burst length is 4, high-level signal BB<1> is output. For example, when the burst lengths are 8 and 16, high-level signals BB<2> and BB<4> are output respectively.

Signals BB<1> to BB<4> are received by multi-input OR gate OR1. An output of the OR gate OR1 functions as signal BL4_BEND. Signal BL4_BEND is asserted (set to the high level) when data having a length equal to burst length 4 is received by the semiconductor memory device 1. The description given below is based on the example wherein the burst length is 4.

Signal BL4_BEND is received by AND gate AD1. AND gate AD1 is also supplied with a power supply potential (i.e., a high-level signal). An output of AND gate AD1 is received by FIFO register set FRS1. Signal BL4_BEND may be supplied directly to FIFO register set FRS1.

FIFO register set FRS1 includes n FIFO registers. The number n is determined based on the specifications of the semiconductor memory device 1 and is, for example, RU (tWR/tCK/2), where tWR is a write recovery time. To start writing, the semiconductor memory device 1 requires the write recovery time from the completion of the reception of write data. The write recovery time is a time required for the data in the page buffer (not shown) of the read and write circuit 12 to be written in memory cell array 11. The write recovery time is determined beforehand in accordance with the write characteristics of the semiconductor memory device 1. Symbol tCK stands for a 1-cycle time (period) of clocks CLK and CLKb. RU means rounding up the figures after the decimal point.

Using n FIFO registers, FIFO register set FRS1 outputs a high-level signal BNWR<BK> when a clock cycle based on value n and required for write recovery elapses from the transition to the high level of signal BL4_BEND, and keeps outputting that high-level signal BNWR<BK> for a certain length of time.

A circuit for generating signal BNWR<BK> is similar in configuration to a circuit for generating signal APCG<BK>. The circuit for generating signal APCG<BK> includes a multiplexer MUX1, an AND gate AD2 and a FIFO register set FRS2. The multiplexer MUX1 receives signals BB<1>, BB<2> and BB<4>. The multiplexer MUX1 also receives signal BL4, BL8 or BL16 from the controller 16. Signals BL4, BL8 and BL16 are based on the burst length set for the semiconductor memory device 1. Where the burst length is 4, the multiplexer MUX1 receives signal BB<1> and outputs it as signal BEND. Signal BEND is asserted (set to the high level) when data having a length equal to the burst length is received by the semiconductor memory device 1.

Signal BEND is received by AND gate AD2. AND gate AD2 also receives signal APEN. Signal APEN is asserted (set to the high level) when auto pre-charge is designated by a read command or a write command. An output of AND gate AD2 is received by FIFO register set FRS2. FIFO register set FRS2 starts receiving high-level signal BEND when signal APEN is at the high level, and starts outputting signal APCG<BK> when a clock cycle based on value k and required for write recovery elapses. Value k represents the number of banks provided and is 8, for example.

Figure 4:
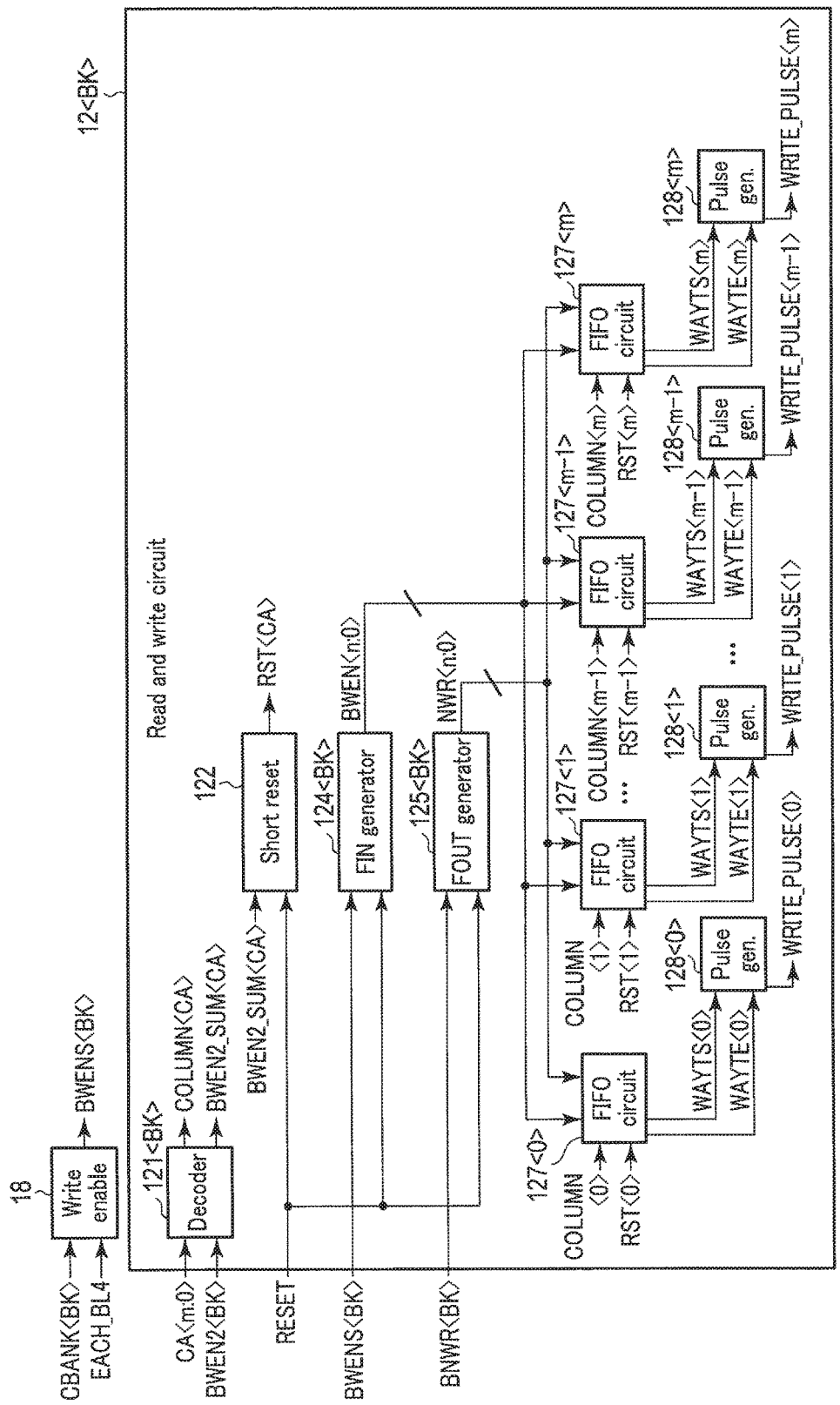
FIG. 4 illustrates function blocks of a read and write circuit in the semiconductor memory device of the first embodiment, the function blocks being illustrated along with related elements of the semiconductor memory device.

Each read and write circuit 12 has such elements and connections as are depicted in FIG. 4. FIG. 4 illustrates function blocks of one read and write circuit 12<BK>, and related elements of the semiconductor memory device 1. The semiconductor memory device 1 comprises a write enable circuit 18. The write enable circuit 18 receives signal CBANK<BK> from the command circuit 17. Signal CBANK<BK> rises to the high level when bank 10<BK> is designated by a write command or a read command as a bank to be accessed. Signal CBANK<BK> rises to the high level each time the write command or read command designating bank 10<BK> is received by the semiconductor memory device 1 (specifically by the command circuit 17).

The write enable circuit 18 also receives signal EACH_BL4 from the command circuit 17. Signal EACH_BL4 is synchronous with clock signal CLK and is asserted (set to the high level) each time the clock cycle corresponding to burst length 4 elapses. The write enable circuit 18 generates signal BWENS<BK> based on signals CBANK<BK> and EACH_BL4, and outputs signal BWENS<BK>.

The read and write circuit 12 comprises a decoder 121<BK>, a resetting control circuit 122, a FIN generator 124<BK>, a FOUT generator 125<BK>, (m+1) FIFO circuits 127 (127<0> to 127<m>), and (m+1) pulse generators 128 (128<0> to 128<m>). In other words, the number of pulse generators 128 is the same as the number of columns provided.

For example, the decoder 121<BK> receives signal CA<m:0> from the command circuit 17, and also receives signal BWEN2<BK>. A set of signals CA<0> to CA<m> (CA<m:0>) jointly specify one column. More specifically, each of signals CA<0> to CA<m> (CA<m:0>) has a value ("0" or "1") for specifying a column to be accessed.

The decoder 121<BK> generate signals COLUMN<CA> and BWEN2_SUM<CA>, based on signal CA<m:0> and signal BWEN2<BK>, and outputs signals COLUMN<CA> and BWEN2_SUM<CA>. The value "CA" is an identifier (address) of one column and is either 0 or a natural number not more than m. Signals COLUMN<0> to COLUMN<m> are kept asserted (kept at the high level) for a certain time when the respective columns 0 to m are designated. In the read and write circuit 12<BK>, signal BWEN2_SUM<CA> is kept asserted (kept at the high level) when both signal COLUMN<CA> and signal BWEN2<BK> are asserted.

Signal BWEN2_SUM<CA> is received by the resetting control circuit 122. The resetting control circuit 122 also receives signal RESET from the command circuit 17. Signal RESET is kept asserted (kept at the high level) for a predetermined time, for the resetting of an operation. While the asserted signal RESET is received, the resetting control circuit 122 keeps asserting signal RST<CA> (which is for column CA designated by signal BWEN2_SUM<CA>) for a certain time.

The FIN generator 124<BK> receives signal BWENS<BK> from the write enable circuit 18, and receives signal RESET from the command circuit 17. Signal BWENS<BK> is a delayed signal of signal BWEN2<BK>. The FIN generator 124<BK> generates signals BWEN<0> to BWEN<n> from signal BWENS<BK> and outputs signals BWEN<0> to BWEN<n> (BWEN<n:0>). The value of n is calculated by RU (tWR/tCK/2), described above.

The FIN generator 124<BK> sets one of signals BWEN<0> to BWEN<n> at the high level each time signal BWENS<BK> is set at the high level. More specifically, the FIN generator 124<BK> sets signals BWEN<0> to BWEN<n> at the high level in the ascending order of the numbers within < >, each time it receives high-level signal BWENS<BK>.

The FOUT generator 125<BK> receives signal BNWR<BK> and signal RESET from the command circuit 17. The FOUT generator 125<BK> generates signals NWR<0> to NWR<n> (NWR<n:0>) from signal NWR<BK> and outputs signals NWR<n:0>. The FOUT generator 125<BK> sets one of signals NWR<0> to NWR<n> at the high level each time signal BNWR<BK> is set at the high level. More specifically, the FOUT generator 125<BK> sets signals NWR<0> to NWR<n> at the high level in the ascending order of the numbers within < >, each time it receives high-level signal BNWR<BK>.

FIFO circuit 127<CA> includes a plurality of FIFO registers and receives signal BWEN<n:0>, signal NWR<n:

0> and signal COLUMN<CA>. The FIFO circuit 127<CA> generate signals WAYTS<CA> and WAYTE<CA>, based on signal BWEN<n:0>, signal NWR<n:0> and signal COLUMN<CA>, and outputs signals WAYTS<CA> and WAYTE<CA>. Specifically, when asserted signal BWEN<N> (N is either 0 or a natural number not more than n) is received while asserted (high-level) signal COLUMN<CA> is being received, the FIFO circuit 127<CA> latches the high-level signal and outputs the asserted (high-level) signal WAYTS<CA>. Also, when asserted (high-level) signal NWR<N> is received, the FIFO circuit 127<CA> outputs asserted (high-level) signal WAYTE<CA>.

The pulse generator 128<CA> receives signal WAYTS<CA> and signal WAYTE<CA>. Based on signal WAYTS<CA> and signal WAYTE<CA>, the pulse generator 128<CA> generates signal WRITE_PULSE<CA> and outputs it. Signal WRITE_PULSE<CA> is kept asserted (kept at the high level) for a predetermined time, based on signal WAYTS<CA> and signal WAYTE<CA>. The pulse generator 128<CA> is, for example, a set/reset latch (RS latch). The RS latch receives signal WAYTS<CA> as a set input and signal WAYTE<CA> as a reset input.

Each read and write circuit 12<BK> has such elements as depicted in FIG. 5. A controller CC activates signal GBL<CA> and signal GSL(CA> (not shown), based on high-level signal WRITE_PULSE<CA>. Signal GBL<CA> selects bit line BL belonging to column CA, and signal GSL<CA> selects source line SL belonging to column CA. A current source circuit CSR<BK> and a current sink circuit CSK<BK> function as a current supply circuit, and jointly permit a write current to flow to memory cell MC which is connected to bit line BL and source line SL in column CA connected to a selected word line WL and which is selected then. The write current flows through memory cell MC in the direction based on data to be written in memory cell MC. The current source circuit CSR<BK> and the current sink circuit CSK<BK> keep supplying the write current while signal WRITE_PULSE<CA> is asserted.

FIG. 6 illustrates the elements of the FIN generator 124<BK> and how they are connected. The FIN generator 124<BK> comprises a shift register. The shift register includes (n+1) flip-flops 1241<0> to 1241<n>. Flip-flops 1241<0> to 1241<n> provide outputs B0 to Bn, respectively. Flip-flops 1241<0> to 1241<n> receive outputs Bn to Bn−1, respectively. Flip-flops 1241 receive signal ICLK1 at their clock inputs and signal ICLK1b at their inverted clock inputs. Signal ICLK1 has the same logic as signal BWENS<BK>.

Outputs B0 to Bn are received by AND gates AD11<0> to AD11<n>, respectively. AND gates AD11<0> to AD11<n> receive delayed signal BWENS<BK>. AND gates AD11<0> to AD11<n> output signals BWEN<0> to BWEN<n>, respectively.

FIG. 7 illustrates the elements of the FOUT generator 125<BK> and how they are connected. The FOUT generator 125<BK> comprises elements that are connected in the same way as the FIN generator 124<BK>. It should be noted, however, that the signal at each node differs from the signal at the corresponding node of the FIN generator 124<BK>. Signal BWENS<BK> in the FIN generator 124<BK> corresponds to signal BNWR<BK> in the FOUT generator 125<BK>. Signal ICLK2 and ICLK2b correspond to signals ICLK1 and ICLK1b, respectively. Signals NWR<0> to NWR<n> correspond to signals BWEN<0> to BWEN<n>, respectively. Outputs C0 to Cn correspond to outputs B0 to Bn, respectively.

FIG. 8 illustrates the elements of the FIFO circuit 127<CA> of the read and write circuit 12<BK> and how they are connected. As shown in FIG. 8, each FIFO circuit 127<CA> comprises (n+1) FIFO registers FR<0> to FR<n>. Each FIFO register FR latches the logic of the signal received at terminal PI at timings based the high-level signal received at terminal PIN. Each FIFO register FR outputs the latched logic (data) from terminal PO at timings based the high-level signal received at terminal POUT.

FIFO registers FR<0> to FR<n> receive signal COLUMN<CA> at terminals PI and signal RST<CA> at terminals RST. FIFO registers FR<0> to FR<n> receive signals BWEN<0> to BWEN<n> at their respective terminals PIN. FIFO registers FR<0> to FR<n> receive signals NWR<0> to NWR<n> at their respective terminals POUT.

Terminal PO of each FIFO register FR is connected to the input of latch circuit L and is also grounded by way of transistor QN1. Transistor QN1 is, for example, an n-type MOSFET and receives, at its gate, signal PORB supplied from the controller 16. Transistor QN1 is turned on to reset the data in the latch circuit L. An output of the latch circuit L is inverted by inverter IV1 and functions as signal An.

FIFO circuit 127 further comprises NAND gates ND1 and ND2, inverters IV5 and IV6, a multi-input OR gate OR11, and delay circuits D1 and D2. NAND gate ND1 receives signals BWENS<BK> and COLUMN<CA>. An output of NAND gate ND1 is supplied to delay circuit D1 and inverter IV5, which are connected in series. An output of inverter IV5 functions as signal WAYTS<CA>.

The OR gate OR11 receives signals NWR<0> to NWR<n> and supplies its output to NAND gate ND2 by way of delay circuit D2. NAND gate ND2 further receives signal An, and supplies its output to inverter circuit IV6. An output of inverter IV6 functions as signal WAYTE<CA>.

Figure 9:
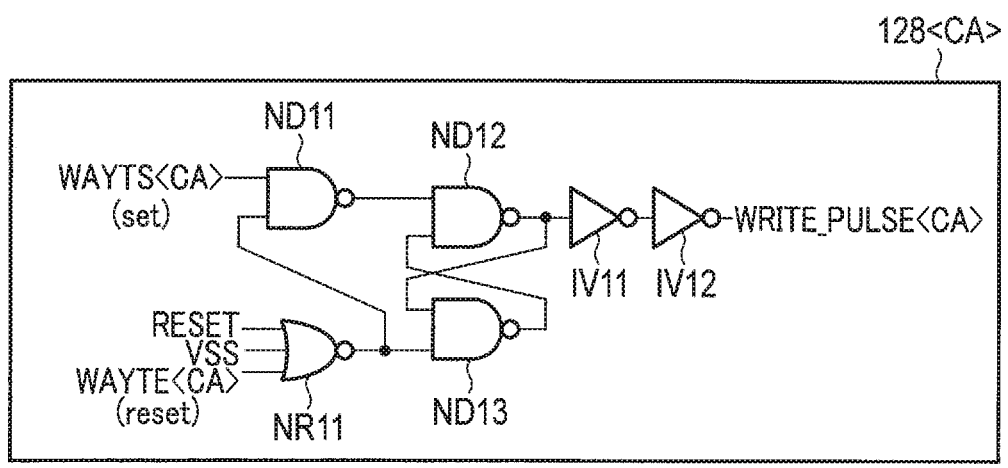
FIG. 9 illustrates the elements of a pulse generator and how they are connected in the semiconductor memory device of the first embodiment.

FIG. 9 illustrates a configuration of the pulse generator 128<CA> of the read and write circuit 12<BK>. The pulse generator 128<CA> comprises NAND gates ND11, ND12 and ND13, NOR gate NR11, and inverters IV11 and IV12. NAND gate ND11 receives signal WAYTS<CA> and an output of NOR gate NR11. NOR gate NR11 receives signal WAYTE<CA> and signal RESET, and is applied with a reference voltage VSS (low level). An output of NAND gate ND11 is supplied to NAND gate ND12. An output of NOR gate NR11 is supplied to NAND gates ND11 and ND13. NAND gate ND12 receives an output of NAND gate ND11 and an output of NAND gate ND13. NAND gate ND13 receives an output of NOR gate NR11 and an output of NAND gate ND12. An output of NAND gate ND12 is supplied to inverter IV11, and an output of inverter IV11 is supplied to inverter IV12. Inverter IV12 outputs signal WRITE_PULSE<CA>.

When high-level signal WAYTS<CA> is supplied (at which time, signal WAYTE<CA> and signal RESET are at the low level), signal WRITE_PULSE rises to the high level in the pulse generator 128<CA>. When high-level signal WAYTE<CA> is supplied, signal WRITE_PULSE<CA> falls to the low level. That is, when high-level WAYTS<CA> is supplied, signal WRITE_PULSE<CA> rises to the high level, permitting a write current to flow to memory cell MC. When high-level WAYTE<CA> is supplied, signal WRITE_PULSE<CA> falls to the low level, stopping the supply of the write current to memory cell MC.

For example, when one write command is supplied to the command circuit 17, the pulse generator 128 receives high-level signal WAYTS<CA> and causes signal WRITE_PULSE<CA> to rise to the high level. Signal WRITE_PULSE<CA> is kept at the high level until high-level WAYTE<CA> is received. When high-level WAYTE<CA> is received, signal WRITE_PULSE<CA> falls to the low level. As a result, the pulse generator 128 outputs signal WRITE_PULSE<CA> having a predetermined pulse width.

Based on signal BWEN2<BK>, write data is transferred to the page buffer and the FIFO circuit 127<CA> is reset. Subsequently, signal WRITE_PULSE<CA> is generated.

[1-2] Write Operation

Figure 10:
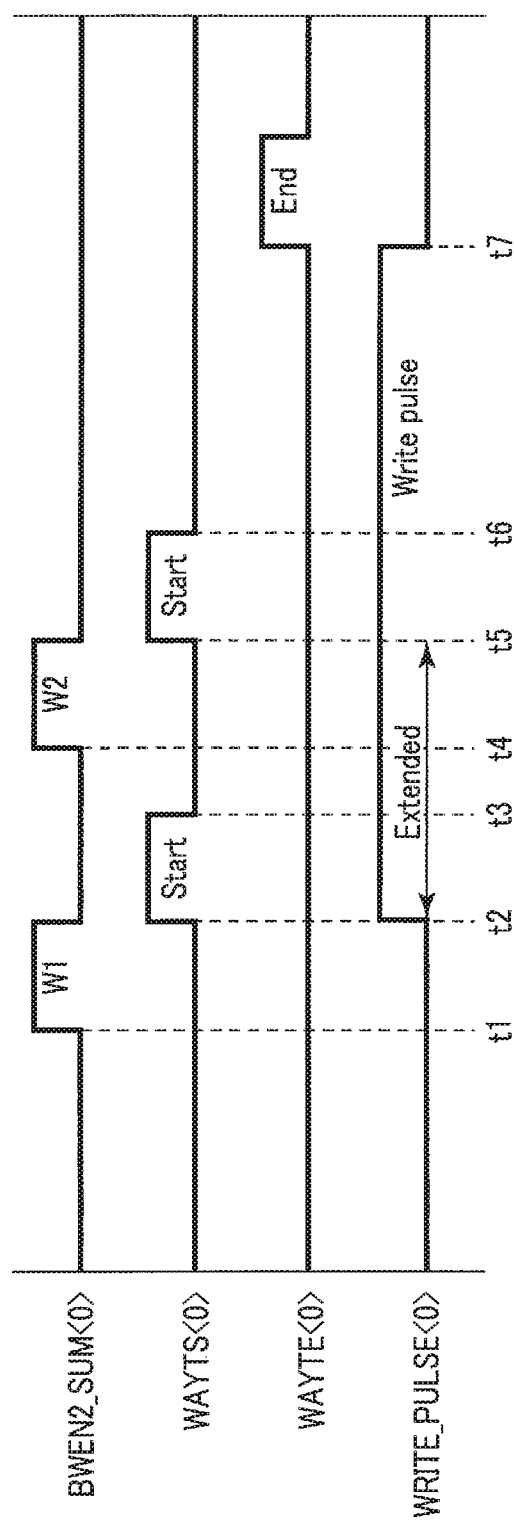
FIG. 10 is a timing chart illustrating signals in writing in the semiconductor memory device of the first embodiment.

FIG. 10 is a timing chart showing writings performed for the semiconductor memory device 1 of the first embodiment, and illustrates in which states the signals are in the period in the writings. Specifically, FIG. 10 is about the writings performed for column 0 (CA=0) of bank 10<BK>. The signals change in the same way for a writing irrespective of the bank for which the writing is performed.

At the start time of the operation shown in FIG. 10, all signals indicated are at the low level (negated). When a write command (hereinafter referred to as a first write command) is supplied to the semiconductor memory device 1, the first write command is transmitted from the input and output circuit 15 to the command circuit 17. The first write command is transmitted from the command circuit 17 to the decoder 121<BK>.

Upon the reception of the first write command, the decoder 121<BK> sets signal BWEN2_SUM<0> (W1) at the high level at time t1 based on the first write command. Signal BWEN2_SUM<0> is kept at the high level for a predetermined length of time and falls to the low level at time t2. Signal BWEN2_SUM<0> (W1) is a delayed signal of a signal generated in response to the input of the first write command. After the input of the first write command, it is necessary to stand by until write data is input and subsequently rewritten in the page buffer. For this reason, signal BWEN2_SUM<0> (W1) is generated, which is delayed by the length of time from the input of the first write command to the completion of recording of the write data in the page buffer.

The transition of signal BWEN2_SUM<0> (W1) to the low level at time t2 causes the FIFO circuit 127<0> to transition signal WAYTS<0> to the high level. Signal WAYTS<0> is a delayed signal of a signal generated in response to the input of the first write command (or signal BWEN2_SUM<0> (W1)). In the description below, it is assumed that the transition of signal WAYTS<0> to the high level is simultaneous with time t2 at which signal BWEN2_SUM<0> transitions to the low level, though in practice the transition of signal WAYTS<0> to the high level may be somewhat later than time t2.

The transition of signal WAYTS<0> to the high level at time t2 causes the pulse generator 128<0> to output high-level signal WRITE_PULSE<0>. As a result of the transition of signal WRITE_PULSE<0> to the high level, the read and write circuit 12<BK> starts supplying a write current to memory cell MC of column 0 at time t2. Signal WAYTS<0> returns to the low level at time t3.

At a predetermined time after the input of the first write command, a next write command (hereinafter referred to as a second write command) is input. When the second write command is supplied to the semiconductor memory device 1, the second write command is transmitted from the input and output circuit 15 to the command circuit 17. The second write command is transmitted from the command circuit 17 to the decoder 121<BK>.

Upon the reception of the second write command, the decoder 121<BK> sets signal BWEN2_SUM<0> (W2) at the high level at time t4. Signal BWEN2_SUM<0> falls to the low level at time t5. The predetermined time mentioned above is a time shorter than the time of the pulse width of signal WRITE_PULSE<0>, generated in response to the input of one write command.

The transition of signal BWEN2_SUM<0> to the low level at time t5 causes the FIFO circuit 127<0> to transition signal WAYTS<0> to the high level. The transition of signal WAYTS<0> to the high level at time t5 causes the pulse generator 128<0> to start outputting high-level signal WRITE_PULSE<0> at time t5. Since signal WRITE_PULSE<0> is already set at the high level as a result of the input of the first write command, signal WRITE_PULSE<0> maintains the high level. Since signal WRITE_PULSE<0> maintains the high level, the read and write circuit 12<BK> keeps supplying the write current to memory cell MC of column 0. Signal WAYTS<0> returns to the low level at time t6.

At time t7, a predetermined time after the transition of signal WAYTS<0> to the high level, signal WAYTE<0> rises to the high level. Signal WAYTE<0> is a delayed signal of a signal generated in response to the input of the second write command (or signal BWEN2_SUM<0> (W2)). More specifically, signal WAYTE<CA> is a signal obtained by delaying a signal generated in response to the input of the second write command (or signal BWEN2_SUM<0> (W2)) by means of a delay circuit employing a shift register, a timer, a counter or the like. Signal WAYTE<CA> transitions from the low level to the high level at a predetermined time after the input of signal BWEN2_SUM<00> (W2).

The transition of signal WAYTE<CA> to the high level at time t7 causes the pulse generator 128<0> to output low-level signal WRITE_PULSE<0>. As a result of the transition of signal WRITE_PULSE<0> to the low level, the read and write circuit 12<BK> stops supplying a write current to memory cell MC of column 0 at time t7.

If the second write command is not input, high level signal WAYTE<0> is generated in response to the input of the first write command (or signal BWEN2_SUM<0> (W1)). In this example, however, the second write command is input before high-level signal WAYTE<0> corresponding to the first write command is generated. Therefore, high-level signal WAYTE<0> corresponding to the first write command is not generated. High-level signal WAYTS<0> is generated in response to the input of the second write command, and thereafter high-level signal WAYTE<0> is generated.

The writings performed for columns 1 to m are similar to the writings performed for column 0.

FIG. 11 is a timing chart illustrating some signals in the writings of the first embodiment. The operation shown in FIG. 11 is started when the semiconductor memory device 1 receives a write command (a first write command) for the first time after it receives an active command.

Clocks CLK and CLKb, signals CA0 to CA9, data strobe signal DQS and data DQ are supplied from the memory controller 2 to the input and output circuit 15. Signals CA0 to CA9 include a bank address, a column address and a command.

First, at time T0, an active command is input. The active command designates an access (write) target bank 10<BK> (bank A in this example). After the input of the active command, a first write command is input at time T1. After the reception of the first write command, the semiconductor memory device 1 is kept on standby for write latency WL (corresponding to three clocks), and receives data strobe signal DQS and write data DQ at time T4. Write data DQ is received at timings when data strobe signal DQS rises or falls. The received write data DQ is supplied to a page buffer (not shown) of the read and write circuit 12<BK>.

A predetermined time after the first write data is received, a next write command (a second write command) is received at time T3. After the reception of the second write command, the semiconductor memory device 1 is kept on standby for write latency WL (corresponding to three clocks), and starts receiving data strobe signal DQS and write data DQ. In this example, write data the same as the write data input in relation to the first write command is input as dummy data. Thus, the write pulse can be extended for the memory cells of the same column without changing the write data.

Figure 12:
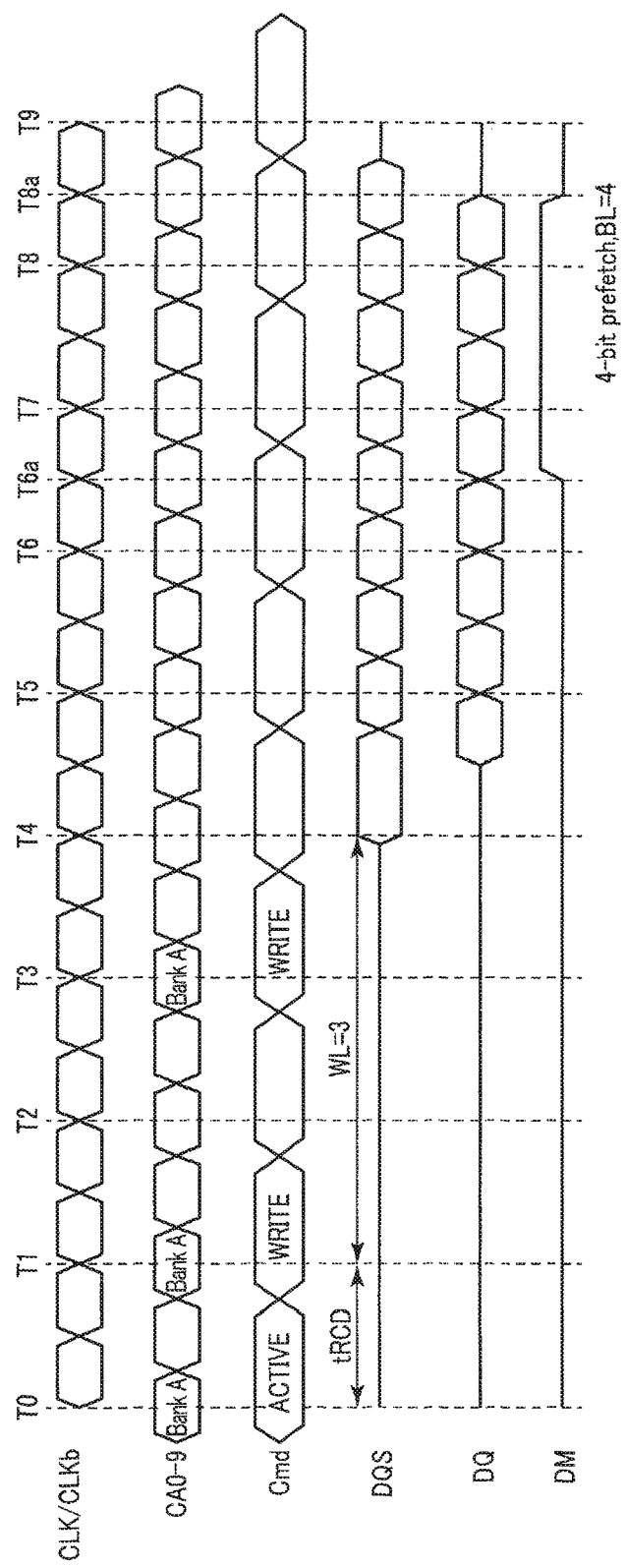
FIG. 12 is a timing chart illustrating commands and signals in a modification of the writing in the semiconductor memory device of the first embodiment.

FIG. 12 is a timing chart illustrating some signals in the writings according to a modification of the first embodiment. According to this modification, the same data as the write data of the first write command is not input as write data of the second write command. Instead, the input write data accompanying the second write command is used as a data mask.

As shown in FIG. 12, write data DQ accompanying the second write command is input from time T6a to time T8a. In this example, data mask signal DM is kept at the high level from time T6a to T8a. Accordingly, the write data input from time T6a to time T8a are ignored, and the write data DQ input at time T4a to time T6a remain in the page buffer. As in the example shown in FIG. 11, the write pulse can be extended for the memory cells MC of the same column with no change to the write data. The other signals and operations shown in FIG. 12 are similar to those shown in FIG. 11.

[1-3] Advantages of First Embodiment

The semiconductor memory device of the first embodiment is advantageous in that the pulse width of a write pulse can be extended without being restricted by circuit layouts, namely, with no need to employ circuits for extending the write pulse, such as a shift register, a timer and a counter.

For example, if a pulse width of a write pulse is extended using a circuit, the additional use of such a circuit results in an increase in the circuit area. The semiconductor memory device of the present embodiment first receives a first write command and then receives a second write command within a predetermined time of the reception of the first write command. The pulse width of the write pulse can be extended more than the case where only one write command is received. The predetermined time after the reception of the first write command is shorter than the time corresponding to the pulse width of the write pulse of the case where only one write command is received.

In the first embodiment, the rise of the pulse width of a write pulse is determined by signal WAYTS<CA>, as shown in FIG. 10. Signal WAYTS<CA> is based on signal BWENS<BK>, and signal BWENS<BK> is based on signal CBANK<BK> and signal EACH_BL4. In addition, signal CBANK<BK> and signal EACH_BL4 are based on signal CA including a write command. Therefore, signal WAYTS<CA> is a signal generated based on the write command.

Furthermore, the fall of the pulse width of a write pulse is determined by signal WAYTE<CA>. Signal WAYTE<CA> is based on signal NWR<n:0> and signal An, and signal NWR<n:0> is based on signal BNWR<BK>. Signal BNWR<BK> is based on signal BL4_BEND, and signal BL4_BEND is based on signal BB<4:1>. In addition, signal BB<4:1> is based on signal CA including a write command. Therefore, signal WAYTE<CA> is a signal generated based on the write command.

Since the second write command is input before signal WAYTE<CA> based on the first write command is generated, the generation of signal WAYTE<CA> based on the first write command is canceled, and the generation of signal WAYTS<CA> and signal WAYTE<CA> based on the second write command is started. Accordingly, signal WAYTS<CA> is generated based on the first write command, and WAYTE<CA> is generated based on the second write command. As a result, the pulse width of the write pulse of signal WRITE_PULSE<CA> can be extended.

The fall of the pulse width of a write pulse was described as being performed based on signal WAYTE<CA>. Instead of this, a circuit for causing the pulse width of a write pulse to fall may be used. Specifically, the pulse width of the write pulse is raised by signal WAYTS<CA after the input of WAYTS<CA>, and the circuit lowers the pulse width of the write pulse after a predetermined time without generating signal WAYTE<CA>.

[2] Second Embodiment

According to the second embodiment, a program pulse is extended by supplying a command from a memory controller 2 to a semiconductor memory device 1. The general configuration and the circuits of the second embodiment are similar to those of the first embodiment. In the following, a description will be given mainly of the features differentiating the second embodiment from the first embodiment.

[2-1] Write Operation

FIG. 13 illustrates command inputs that are used for the writing according to the second embodiment. As shown in FIG. 13, an active command (Active), a first write command (Write), a command (VNOP: Variable No operation) and a second write command (Write w/DM) (with data masks) are sequentially input to the semiconductor memory device 1 from the memory controller 2. In the following, bank address BA [2:0] and column C [5:2] (page address) will be taken as examples.

In response to the first write command and the second write command, the write operations are performed for the same bank address 0 and the same column 0. Since the write data accompanying the second write command is data-masked, it is not input to the page buffer, and the write data accompanying the first write command is retained in the page buffer as it is.

Command VNOP determines the length of time between the input of the first write command and the input of the second write command. The value of command VNOP is changed in accordance with the length of time by which the pulse width of a write pulse is extended.

Assuming that the length of time by which the pulse width of a write pulse is extended is X [ns], the value of command VNOP is changed in accordance with the clock frequency [MHz] of clocks CLK and CLKb (or the period tCK [ns] of the clocks).

FIG. 14 shows how the cycle numbers of the clocks are when the length of time X by which the pulse width of a write pulse is extended is 10 or 20 [ns]. For example, if the pulse width of a write pulse should be extended by 10 ns when the clock frequency is 533 and the clock cycle is 1.875, then command VNOP is set at "5 cycles." If the pulse width of a write pulse should be extended by 20 ns when the clock frequency is 400 and the clock cycle is 2.5, then command VNOP is set at "7 cycles." The value of command VNOP is given by "VNOP=RU (X/tCK)−1", where RU means rounding up the figures after the decimal point, as described above.

Figure 15:
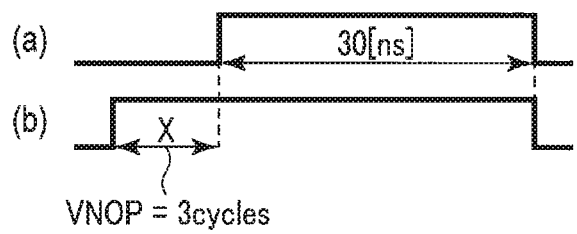
FIG. 15 illustrates a write pulse generated in the writing in the semiconductor memory device of the second embodiment.

FIG. 15 shows a write pulse to which the example shown in FIG. 14 is applied. The write pulse is used when the clock frequency is 400 MHz, the clock cycle is 2.5 ns and command VNOP is "3 cycles." As shown at (b) of FIG. 15, the pulse width of the write pulse is (30+X) ns. As shown at (a) of FIG. 15, the unextended pulse width of the write pulse, namely the pulse width of the case where one write command is input, is 30 ns.

Where the write target column is changed to another, command NOP (No operation) is input after the input of the second write command, as shown in FIG. 13. Then, a write command (Write), command VNOP and a write command (Write w/DM) are sequentially input. In this way, the write target column is changed from "0" to "1", and the pulse width of a write pulse can be extended. Command NOP means that no operation is performed during the related one cycle.

Note that the command VNOP is inputted according to the second embodiment, instead of the command VNOP, the command NOP may be inputted.

[2-2] Advantages of Second Embodiment

As described above, the timing at which the second write command is executed can be changed by inputting command VNOP after the input of the first write command. As a result, the length of time by which the pulse width of a write pulse is extended can be controlled. For example, if the active command (Active), the first write command (Write), the command (VNOP), and the second write command (Write w/DM) are sequentially input by programming, the pulse width of a write pulse can be easily extended.

For example, the embodiments can be applied to a resistance change type memory similar to an MRAM, such as a ReRAM (resistive random access memory) and a PCRAM (phase-change random access memory) including an element for storing the data using the resistance change of the element.

The embodiments can be applied to a semiconductor memory device including an element for storing the data using the resistance change of the element by applying a necessary current or voltage, or for reading the data stored to the element by converting a resistance difference depending on resistance change of the element into a current difference or a voltage difference.

While certain embodiments have been described, these embodiments have been presented by way of example only, and are not intended to limit the scope of the embodiments. Indeed, the novel methods and systems described herein may be embodied in a variety of other forms; furthermore, various omissions, substitutions, and changes in the form of the methods and systems described herein may be made without departing from the spirit of the embodiments. The accompanying claims and their equivalents are intended to cover such forms or modifications as would fall within the scope and spirit of the embodiments.

What is claimed is:

1. A semiconductor memory device comprising:
a memory cell; and
a first circuit configured to generate a write pulse based on a write command and supply a write current to the memory cell in accordance with the write pulse,
wherein:
the first circuit supplies the write current to the memory cell during a first period when the first circuit receives a first write command,
the first circuit extends the first period during which the write current is supplied to the memory cell when the first circuit receives a second write command within a first time after reception of the first write command, and an address and write data that are input accompanying the second write command are identical to an address and write data that are input accompanying the first write command.

2. The semiconductor memory device according to claim 1, wherein the first time is shorter than a time corresponding to a pulse width of a first write pulse which is generated when the first circuit receives the first write command.

3. The semiconductor memory device according to claim 1, further comprising a controller configured to issue the first write command and to issue the second write command within the first time after issue of the first write command.

4. The semiconductor memory device according to claim 1, wherein a first write pulse is asserted in response to a first signal generated based on the first write command, and the first write pulse is negated in response to a second signal generated based on the second write command.

5. The semiconductor memory device according to claim 4, wherein:
the first signal is a delayed signal of a signal generated in response to input of the first write command, and
the second signal is a delayed signal of a signal generated in response to input of the second write command.

6. The semiconductor memory device according to claim 1, wherein a pulse width of a first write pulse is varied in accordance with a first command if the first command is input to the first circuit after input of the first write command and before input of the second write command.

7. The semiconductor memory device according to claim 1, wherein the memory cell includes a variable resistance element.

8. A semiconductor memory device comprising:
a memory cell; and
a first circuit configured to generate a write pulse based on a write command and supply a write current to the memory cell in accordance with the write pulse,
wherein:
the first circuit supplies the write current to the memory cell during a first period when the first circuit receives a first write command,
the first circuit extends the first period during which the write current is supplied to the memory cell when the first circuit receives a second write command within a first time after reception of the first write command, and
first write data that is input accompanying the first write command is stored in a buffer, and the buffer is configured to retain the first write data if second write data is input accompanying the second write command.

9. A semiconductor memory device comprising:
a memory cell; and
a first circuit configured to generate a write pulse based on a write command and supply a write current to the memory cell in accordance with the write pulse,
wherein:
the first circuit supplies the write current to the memory cell during a first period when the first circuit receives a first write command,
the first circuit extends the first period during which the write current is supplied to the memory cell when the first circuit receives a second write command within a first time after reception of the first write command, and
the first circuit comprises:
a decoder which decodes the first and second write commands, and selects the memory cell as a memory cell for which a write operation is to be performed;
a circuit which generates a write signal based on the first and second write commands;

a pulse generator which generates first and second write pulses based on the write signal; and a current supply circuit which keeps supplying the write current to the memory cell for a length of time corresponding to the write pulse.

\* \* \* \* \*